(12) United States Patent
Gordon

(10) Patent No.: US 9,563,381 B2
(45) Date of Patent: Feb. 7, 2017

(54) METHOD OF CONTROLLING VOLATILE MEMORY AND SYSTEM THEREOF

(71) Applicant: STORONE LTD., Ra'Anana (IL)

(72) Inventor: Raz Gordon, Hadera (IL)

(73) Assignee: STORONE LTD., Ra'anana (IL)

( * ) Notice: Subject to any disclaimer, the term of this patent is extended or adjusted under 35 U.S.C. 154(b) by 0 days.

(21) Appl. No.: 14/969,753

(22) Filed: Dec. 15, 2015

(65) Prior Publication Data

US 2016/0202930 A1 Jul. 14, 2016

(30) Foreign Application Priority Data

Jan. 11, 2015 (IL) .......................................... 236627

(51) Int. Cl.
*G06F 3/06* (2006.01)
*G06F 1/24* (2006.01)
*G11C 7/24* (2006.01)

(52) U.S. Cl.
CPC ............... *G06F 3/0629* (2013.01); *G06F 1/24* (2013.01); *G06F 3/0604* (2013.01);
(Continued)

(58) Field of Classification Search
None
See application file for complete search history.

(56) References Cited

U.S. PATENT DOCUMENTS 5,007,027 A * 4/1991 Shimoi ...................... G06F 1/30
365/229

5,524,232 A * 6/1996 Hajeer .................. G06F 13/409
711/115
(Continued)

FOREIGN PATENT DOCUMENTS

EP 0613077 A 8/1994
GB 2479270 A 10/2011
(Continued)

OTHER PUBLICATIONS

Micron Techonology, Micron DDR2 SDRAM Registered DIMM (RDIMM) data sheet, 2003, pp. 1-18, downloaded from datasheetlib.com.*
(Continued)

*Primary Examiner* — Brian Peugh
*Assistant Examiner* — Dustin Bone
(74) *Attorney, Agent, or Firm* — Oliff PLC

(57) ABSTRACT

A method of controlling volatile memory (VM) and VM controller operatively connectable to VM. The method includes: intercepting reset signal intended to cause reset of, at least, VM; assessing transfer-related (TR) state related to the VM; blocking the intercepted reset signal from reaching VM if the assessed TR state does not meet predefined criterion, and transferring the reset signal to VM if the assessed TR state meets the predefined criterion. The VM controller is configured to: receive a reset signal originating in computer system and intended to cause reset of, at least, the VM; detect if the VM has been powered-up during a predetermined timeframe prior to the receipt of the reset signal; and block the received reset signal from reaching the VM if the VM powering-up has not been detected and transfer the reset signal to the VM if the VM powering-up has been detected.

19 Claims, 5 Drawing Sheets

(52) U.S. Cl.
CPC .......... *G06F 3/0653* (2013.01); *G06F 3/0673* (2013.01); *G11C 7/24* (2013.01)

(56) References Cited

U.S. PATENT DOCUMENTS

| | | | |
|---|---|---|---|
| 5,689,635 A | 11/1997 | Petrosino | |
| 5,872,967 A * | 2/1999 | DeRoo | G06F 9/30101 711/E12.083 |
| 5,889,933 A | 3/1999 | Smith | |
| 5,898,635 A * | 4/1999 | Raad | G11C 5/143 365/189.09 |
| 6,119,200 A | 9/2000 | George | |
| 6,697,954 B1 | 2/2004 | Stufflebeam | |
| 7,007,175 B2 * | 2/2006 | Chang | G06F 1/3203 713/300 |
| 8,074,112 B1 | 12/2011 | Chang et al. | |
| 2001/0047473 A1 * | 11/2001 | Fallon | G06F 3/0613 713/2 |
| 2003/0007409 A1 * | 1/2003 | Ishikuri | G11C 5/147 365/226 |
| 2007/0260865 A1 | 11/2007 | Kuo | |
| 2008/0071972 A1 * | 3/2008 | Kimura | G06F 1/305 711/103 |
| 2009/0063731 A1 | 3/2009 | Gower et al. | |
| 2009/0077307 A1 | 3/2009 | Kaburlasos et al. | |
| 2012/0190219 A1 | 7/2012 | Pai et al. | |
| 2012/0254529 A1 * | 10/2012 | Wang | G06F 1/24 711/105 |
| 2013/0227257 A1 | 8/2013 | Singh et al. | |
| 2014/0351500 A1 * | 11/2014 | Best | G06F 12/0638 711/103 |
| 2014/0372740 A1 * | 12/2014 | Semenko | G06F 11/0766 713/2 |
| 2014/0372746 A1 * | 12/2014 | Aloni | G06F 8/67 713/2 |
| 2015/0095702 A1 * | 4/2015 | Woodward | G06F 11/1441 714/24 |

FOREIGN PATENT DOCUMENTS

| | | |
|---|---|---|
| JP | H06-83488 A | 3/1994 |
| JP | 2002-099357 A | 4/2002 |
| WO | 89/09957 A1 | 10/1989 |

OTHER PUBLICATIONS

DDR3 SDRAM Standard. JESD79-3F. Published by JEDEC Solid State Technology Association, 2012.
DDR4 SDRAM. JESD79-4. Published by JEDEC Solid State Technology Association, 2012.

* cited by examiner

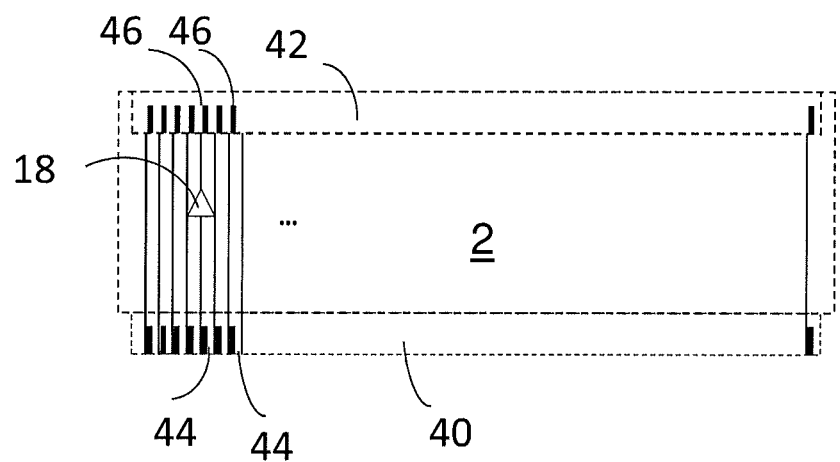

US 9,563,381 B2

METHOD OF CONTROLLING VOLATILE MEMORY AND SYSTEM THEREOF

TECHNICAL FIELD

The presently disclosed subject matter relates generally to data storage in a memory, and in particular to preserving data stored in a volatile memory.

BACKGROUND

Most computer systems use volatile memory (VM) (e.g. dynamic random access memory (DRAM) including variations thereof such as SDRAM, and other types of volatile RAM such as volatile SRAM, etc.) for temporarily storing data. Temporarily retained in the volatile memory, data may be lost when power supply to the VM is interrupted. If a computer system suffers from a sudden failure, e.g. a hardware or software crash, there is a risk that temporarily retained data may be permanently lost.

Methods of preserving data in the event of a power interruption have been recognized in the conventional art and various techniques have been developed to provide solutions. For example:

U.S. Pat. No. 5,889,933 discloses a RAID system that has two write modes. In a normal write mode, a host computer receives a write confirmation once an array controller receives data from the host computer. In a safe write mode, however, the array controller copies to non-volatile random access memory (NVRAM) all data received from the host computer for writing to disk drives. The array controller switches from normal write mode to safe write mode upon detection of an AC power failure.

U.S. Pat. No. 8,074,112 discloses a method for memory backup including: detecting a failure in a main power supply that supplies power to a volatile memory that is coupled to a RAID controller, switching to a temporary power supply to supply power to the volatile memory in response to detecting the main power supply failure, and transferring data from the volatile memory to a non-volatile memory coupled to the RAID controller subsequent to switching to the temporary power supply.

European Patent No. 0613077 discloses a method for preserving dirty data, whereby known test information is written to a memory address. A VM reset signal is blocked until the processor accesses the memory address and compares the information stored in the memory address with the known test information. If the comparison fails or the processor cannot access the memory address, it is determined that the reset signal was caused by a power failure and the memory is reset. However, if the comparison succeeds, it is determined that the reset signal was not caused by a power failure and the memory is not reset thereby preserving the memory contents.

GENERAL DESCRIPTION

In accordance with certain aspects of the presently disclosed subject matter, there is provided a method of controlling a volatile memory (VM), the method comprising: intercepting a reset signal intended to cause a reset of, at least, the VM, the interception provided by a VM controller operatively coupled to the VM; assessing, by the VM controller, a transfer-related (TR) state related to the VM; and blocking, by the VM controller, the intercepted reset signal from reaching the VM if the assessed TR state does not meet a predefined criterion, and transferring the reset signal to the VM if the assessed TR state meets the predefined criterion. The method can further comprise obtaining, by the VM controller, data informative of the TR state, the data to be used for assessing the TR state.

In accordance with further aspects of the presently disclosed subject matter, assessing the TR state can be provided with a predefined delay after the intercepting. The TR state can be characterized by a powering event related to the VM having occurred during a predetermined timeframe prior to the interception, and the predefined criterion can be met if the VM has been powered up during the timeframe.

In accordance with further aspects of the presently disclosed subject matter, the predefined criterion can be met if an elapsed time between a stabilization of VM power after powering up and reset signal interception is less than a predefined time.

In accordance with certain further aspects of the presently disclosed subject matter the TR state can be characterized by a source of the reset signal, and the predefined criterion can be met if the source of the reset signal is selected from a predefined list of sources.

In accordance with further aspects of the presently disclosed subject matter, the reset signal can be intended to cause a reset of a plurality of VMs, and each VM can be characterized by its own predefined transfer criterion, wherein the VM controller can assess the TR state of each VM of the plurality of VMs, and compare, for each given VM, the assessed TR state with the respective predefined criterion, and transfer or block the reset signal to the given VM in accordance with the results of the comparison.

In accordance with certain other aspects of the presently disclosed subject matter, there is provided a method of controlling a volatile memory (VM) comprised in a computer system, the method comprises: intercepting a reset signal originating in the computer system and intended to cause a reset of, at least, the VM, the interception provided by a VM controller comprised in the computer system and operatively coupled to the VM; detecting, by the VM controller, if the VM has been powered-up during a predetermined timeframe prior to the interception; and blocking, by the VM controller, the intercepted reset signal from reaching the VM if the VM powering-up has not been detected and transferring the reset signal to the VM if the VM powering-up has been detected.

In accordance with certain other aspects of the presently disclosed subject matter, there is provided a VM controller operatively connectable to the VM and configured to: receive a reset signal originating in a computer system and intended to cause a reset of, at least, the VM; detect if the VM has been powered-up during a predetermined timeframe prior to the receipt of the reset signal; and block the received reset signal from reaching the VM if the VM powering-up has not been detected and transfer the reset signal to the VM if the VM powering-up has been detected.

In accordance with certain other aspects of the presently disclosed subject matter, there is provided a motherboard comprising the VM controller integrated therein and configured in according with teachings of the presently disclosed subject matter.

In accordance with certain other aspects of the presently disclosed subject matter, there is provided a server comprising the VM, a motherboard and the VM controller, the VM controller configured in according with teachings of the presently disclosed subject matter and operatively interconnecting the motherboard and the VM.

In accordance with certain other aspects of the presently disclosed subject matter, there is provided a device capable of interconnecting a motherboard and a VM, the device comprising: a connector configured to plug into a memory socket of the motherboard, the connector comprising a plurality of pins, at least one first pin to receive a reset signal transmitted via the motherboard and intended to cause a reset of, at least, the VM; a VM controller operatively coupled to the connecter and operable to: receive a reset signal originating in a computer system and intended to cause a reset of at least, the VM, and to detect if the VM has been powered-up during a predetermined timeframe prior to the receipt of the reset signal, and to block the received reset signal from reaching the VM if the VM powering-up has not been detected and transfer the reset signal to the VM if the VM powering-up has been detected; and a slot operatively coupled to the VM controller and configured to enable plugging the VM into the device, the slot comprising a plurality of contacts, at least one first contact to transfer the reset signal to the VM. The plurality of pins can include at least one second pin, and the plurality of contacts can include at least one second contact, wherein the at least one second pin and the at least one second contact are coupled in a manner enabling transparent transferring of data between the motherboard and the VM.

In accordance with certain other aspects of the presently disclosed subject matter, there is provided a server comprising the VM, the motherboard and the device interconnecting the motherboard and the VM and configured in according with teachings of the presently disclosed subject matter.

In accordance with further aspects and, optionally, in combination with other aspects of the presently disclosed subject matter, blocking or transferring the intercepted reset signal, or detecting if the VM has been powered up, can be provided with a predefined delay after the intercepting.

In accordance with further aspects and, optionally, in combination with other aspects of the presently disclosed subject matter, blocking the intercepted reset signal can be provided if an elapsed time between a stabilization of VM power after powering up and reset signal interception exceeds a predefined time.

In accordance with further aspects and, optionally, in combination with other aspects of the presently disclosed subject matter, the VM controller can comprise a delay line and a buffer, wherein the buffer is configured to: receive, via a first input, from the delay line data indicative of VM power at the beginning of the predetermined timeframe; to detect if the VM has been powered-up during a predetermined timeframe prior to the receipt of the reset signal, detection to be provided using the data received from the delay line; to receive, via a second input, the reset signal; and to block the received reset signal from reaching the VM if the VM powering-up has not been detected and to transfer the reset signal to the VM if the VM powering-up has been detected.

In accordance with further aspects and, optionally, in combination with other aspects of the presently disclosed subject matter, the VM controller can be integrated with the VM, or integrated with a motherboard comprised in the computer system, or integrated with an extender of a memory socket of a motherboard comprised in the computer system.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 4B is a schematic cross-sectional view of the socket extender of FIG. 4A taken along the line AA.

DETAILED DESCRIPTION OF EMBODIMENTS

In the following detailed description, numerous specific details are set forth in order to provide a thorough understanding of the presently disclosed subject matter. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "receiving", "sending", "transmitting", "intercepting", "checking", "obtaining", "assessing", "detecting", "comparing", "transferring", "blocking", "counting", "delaying", "postponing" or the like, refer to the action(s) and/or process(es) of a computer system that manipulate and/or transform data into other data, said data represented as physical, such as electronic, quantities and/or said data representing the physical objects. The terms "computer system" and "computer" should be expansively construed to cover any kind of electronic device with data processing capabilities including, by way of non-limiting example, the computer system disclosed in the present application.

The operations in accordance with the teachings herein may be performed by a computer specially constructed for the desired purposes or by a general-purpose computer specially configured for the desired purpose by a computer program stored in a computer readable storage medium.

The term "criterion" used in this patent specification should be expansively construed to include any compound criterion, including, for example, several criteria and/or their logical combinations.

The references cited in the background teach some principles of controlling a VM that may be applicable to the presently disclosed subject matter. Therefore the full contents of these publications are incorporated by reference herein where appropriate for appropriate teachings of additional or alternative details, features and/or technical background.

Figure 1:
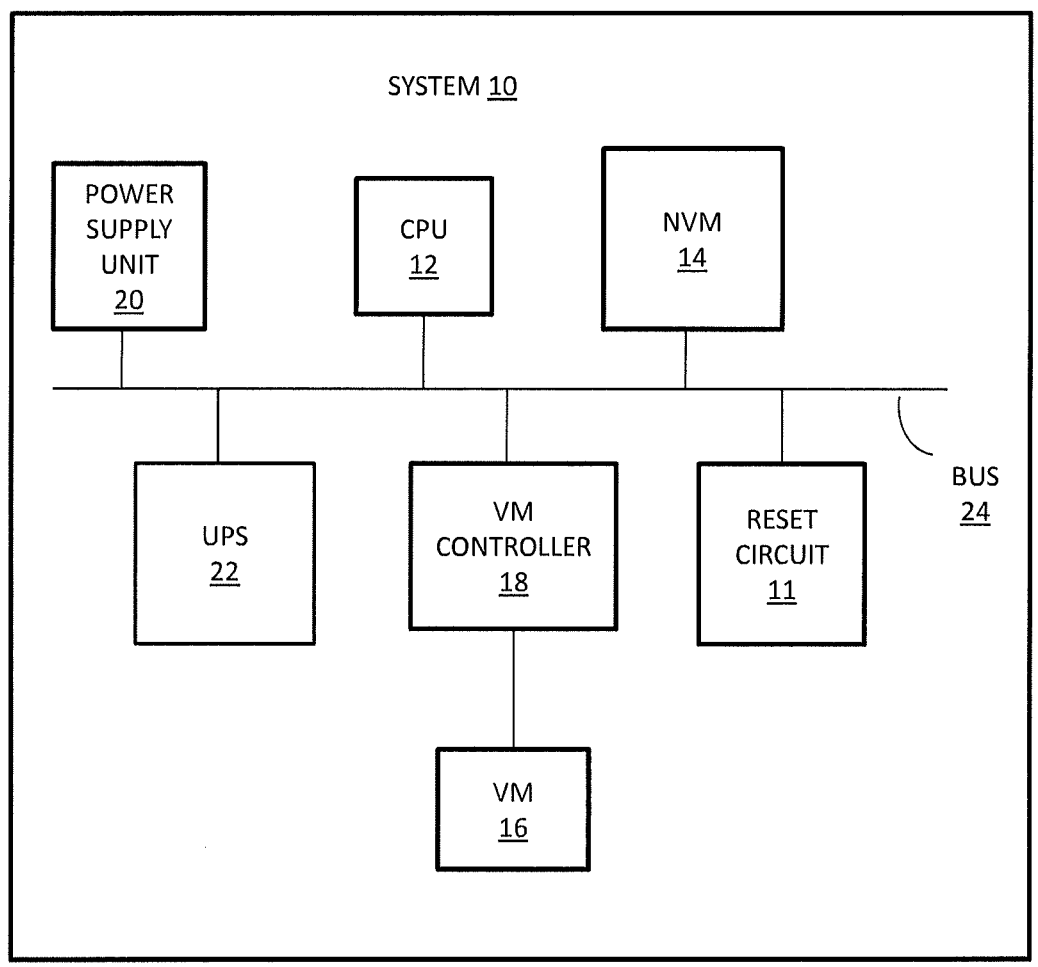
FIG. 1 is a generalized functional diagram of a computer system according to certain embodiments of the presently disclosed subject matter.

Bearing this in mind, attention is drawn to FIG. 1, where there is illustrated a generalized functional diagram of a computer system capable of controlling at least one VM according to certain embodiments of the presently disclosed subject matter.

In certain circumstances, a computer system issues an internal system-wide reset signal to reset the various circuitry comprised within the computer system to their initial states. By way of non-limiting example, the reset signal can be issued during a startup process (e.g. booting or rebooting). Rebooting (user-initiated or automatically) may be necessary, for example, in a case of the system failure, if the system has locked-up, if the system is operating improperly, if new software has been loaded into the system, etc. As used herein, "cold boot" should be understood to mean a computer system start or restart procedure where the computer system is powered up from a previously powered-down state (where power was not supplied to the computer system and more specifically to one or more VMs thereof). As used herein, "warm boot" should be understood to mean a computer system restart procedure where the computer system maintains a previous powered-on state. For example, switching on a conventional computer using, e.g., an ON/OFF switch off located on the exterior shell of the computer system generally results in a cold boot, while restarting the computer using, e.g., a CTRL-ALT-DEL key combination generally results in a warm boot.

When a reset signal is received by a VM, the data contained within the VM is subject to loss.

System 10 includes a reset circuit 11, central processing unit (CPU) 12, a non-volatile memory (NVM) 14 (e.g. one or more hard disks), a VM 16, a VM controller 18, and a power supply unit 20. In some embodiments, reset circuit 11, CPU 12, NVM 14, VM 16, VM controller 18, and power supply unit 20 are operatively coupled to one another, for example via a bus 24. For purpose of illustration, bus 24 in the embodiment shown in FIG. 1 should be understood to include power and data lines. That is, a power line in bus 24 is capable of transporting power from power supply unit 20 to the other system components, and data lines in bus 24 are capable of transporting data communications between the various components of system 10 that communicate data with other system components.

The operation of system 10 will now be described. On a cold boot, power supply unit 20 begins supplying externally-sourced power to components of system 10 along a power line of bus 24. Subsequently, reset circuit 11 issues a reset signal along a data line of bus 24 (e.g. via a hard wire). In certain embodiments, a reset signal may instead be issued by CPU 12 along a data line of bus 24. The reset signal functions to signal certain other components which are connected to bus 24, including VM 16, to initialize to their respective initial states. In some embodiments, reset circuit 11 or CPU 12 additionally sends a reset signal to appropriate system components at other times, e.g. on a warm boot. If VM 16 receives a reset signal, data in VM 16 is subject to loss.

It is noted that, alternatively or additionally to the reset signal initiated within the computer system, the VM can receive a reset signal from an external source (e.g. an external computer system, an external application, etc.).

A reset signal can be characterized by two logical states: state A=0 of the reset signal (LOW reset signal) corresponds to asserted reset condition and state A=1 of the reset signal (HIGH reset signal) corresponds to de-asserted reset condition.

Unless specifically stated otherwise, it is appreciated that throughout the specification the term "reset signal" should be expansively construed to cover a computer data signal intended to cause a reset of, at least, the VM (i.e. LOW reset signal).

During operation of system 10, there may be data temporarily stored in VM 16. At times, system 10 may unexpectedly fail before the temporarily retained data has been copied to NVM 14, leaving such data vulnerable to loss. For example, temporarily retained data may be lost if a reset signal is received by VM 16 before the temporarily retained data is destaged (e.g. moved to NVM 14). If the unexpected failure (or other reasons) causes system 10 to power down or cold boot, data temporarily retained in VM 16 can be assumed to be invalid since power is removed from VM 16. On the other hand, if the unexpected failure, command from a user, or other reasons, cause system 10 to warm boot, a reset signal, when received by VM 16, causes valid data, which could be retained in the VM if the reset signal could have been blocked, to be subject to loss.

Optionally, system 10 can further include a UPS 22 configured to detect a loss of power from power supply unit 20 and, with no interruption in power, to begin supplying backup power via bus 24 to components of system 10. As will be detailed below, during UPS powering, data temporarily retained in VM 16 can be properly saved to NVM 14.

As will be further detailed with reference to FIGS. 2-4, VM controller 18 is configured, according to the teachings of the presently disclosed subject matter, to intercept a reset signal prior to the reset signal reaching VM 16. Upon intercepting a reset signal, VM controller 18 decides whether to transfer the reset signal to VM 16 or to block the reset signal from reaching VM 16. By way of non-limiting example and as will be detailed below, VM controller 18 can transfer the reset signal if system 10 has undergone a restart with loss of power (i.e. a cold boot), and can block the reset signal from reaching VM 16 if system 10 has undergone a restart with no loss of power (i.e. a warm boot).

Those skilled in the art will readily appreciate that the teachings of the presently disclosed subject matter are not bound by the system illustrated in FIG. 1, and that equivalent and/or modified functionality can be consolidated or divided in another manner. In addition, those skilled in the art will appreciate that some components which are shown in FIG. 1 as residing within system 10 can also reside externally of system 10 while performing the same or similar functionality.

For purpose of illustration only, the following description is provided with respect to an internal reset signal originating from a reset circuit in a computer system. Those skilled in the art will readily appreciate that the teachings of the present subject matter are applicable in a similar manner to a reset signal intended to be received by the VM from other sources, including CPU, internal applications running in the computer system, external applications sending, directly or indirectly, a reset signal to the VM, etc.

Figure 2:
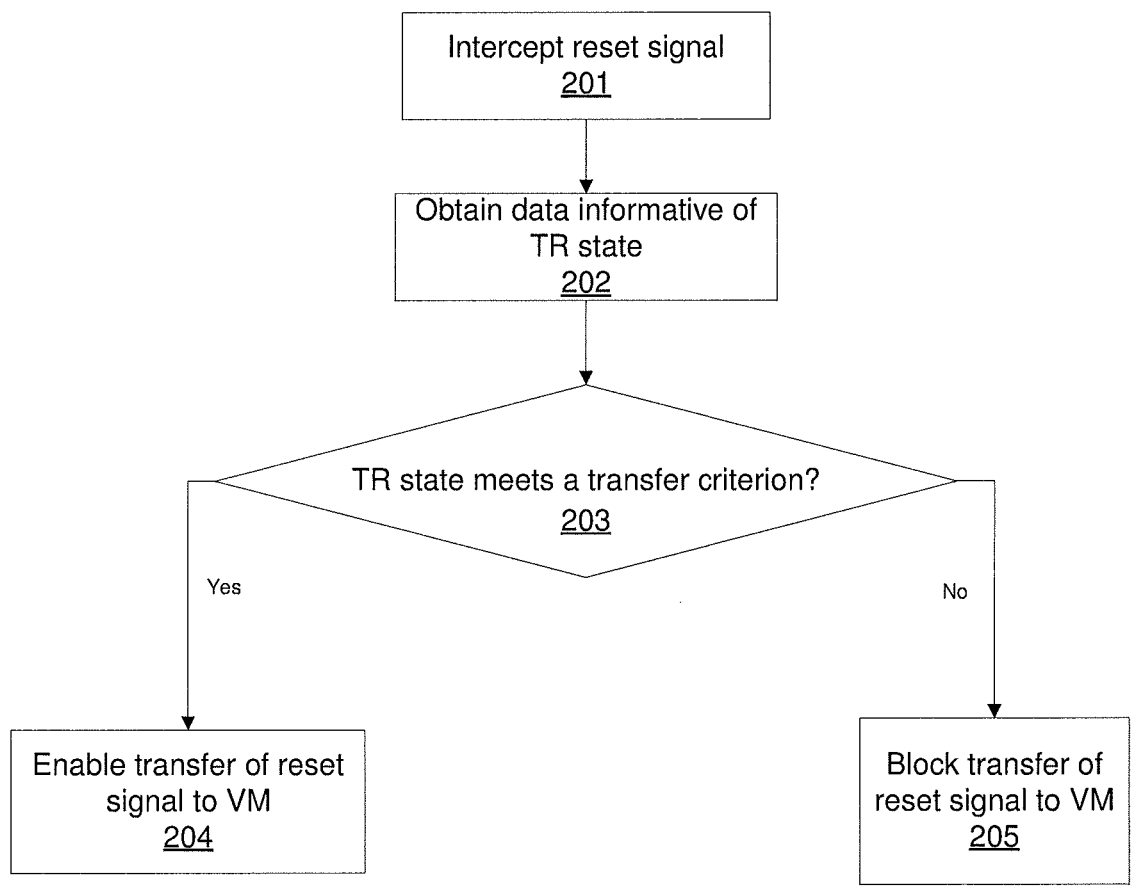
FIG. 2 is a generalized flow chart of controlling a VM according to certain embodiments of the presently disclosed subject matter.

Referring now to FIG. 2, there is illustrated a generalized flow chart of controlling a VM according to certain embodiments of the presently disclosed subject matter.

VM controller 18 intercepts (201) an internal reset signal originating from a component in a computer system and intended to be received, at least, by VM 16. For example, the reset signal can originate from reset circuit 11.

As will be further detailed with reference to FIG. 3, VM controller 18 obtains (202) data informative of a transfer-related state, assesses the transfer-related (TR) state, and checks (203) if the TR state meets a predefined criterion for transferring a reset signal. It is appreciated that data informative of a transfer-related state can be data informative of a TR state of system 10 generally and/or of a TR state of a specific component of system 10, including, without limitation, a TR state of VM 16.

If the assessed TR state meets a predefined transfer criterion, VM controller 18 enables (204) transferring of the reset signal to VM 16. If on the other hand, the assessed TR state does not meet the predefined transfer criterion, VM controller 18 blocks (205) a transferring of the reset signal to VM 16. Thus, VM controller 18 applies to the intercepted reset signal a selective transferring logic which causes the intercepted reset signal to be transferred to VM 16 only if the assessed TR state meets a predefined transfer criterion.

A TR state can be related to powering of VM 16. By way of non-limiting example, and as will be further detailed with reference to FIGS. 3-4, VM controller 18 can obtain data informative of a powering event related to VM 16 (e.g. a powering-up of VM 16). A predefined transfer criterion can be, for example, that a powering event related to VM 16 occurred at some point within a predetermined timeframe prior to reset signal interception.

Unless specifically stated otherwise, the term "predetermined timeframe n prior to interception of reset signal" shall be construed to cover a period ended when the reset signal is intercepted and having a predetermined duration n.

Optionally, the predetermined timeframe can vary in accordance with predefined rules. By way of non-limiting example, the duration n of the predetermined timeframe can vary depending on the number of previously intercepted reset signals, and the number of intercepted reset signals can be calculated by a VM controller which can include a counter adapted to perform the respective calculations. If VM controller 18 obtains data informative that a powering event at VM 16 has occurred in the predetermined timeframe prior to reset signal interception (indicating, e.g. a cold boot or cold reboot), the intercepted reset signal is transferred to VM 16. On the other hand, if the data obtained by VM controller 18 is informative of VM 16 having been continuously powered during the predetermined timeframe prior to reset signal interception, (indicating, e.g. that a likely cause of the reset signal was a warm boot), the intercepted reset signal is not transferred to VM 16.

Alternatively or additionally to the TR state being related to powering, the TR state can be related to a source of the reset signal, or to other conditions not related to powering. By way of non-limiting example, VM controller 18 can transfer the reset signal if the TR state corresponds to a warm boot, however the reset signal does not originate from reset circuit 11. In some embodiments the predefined transfer criterion is met if the source of the reset signal is selected from a predefined list of sources.

Optionally, VM controller 18 can control a plurality of volatile memories, wherein a predefined transfer criterion can differ for different memories. By way of non-limiting example, if a transfer criterion is related to a source of the reset signal, VM controller 18 can transfer the reset signal to some controlled memories whilst blocking delivery of the reset signal to other controlled memories depending on respective transfer criteria.

Optionally, the process described with reference to FIG. 2 can include additional steps (not shown) before step (204). If the assessed TR state meets the predefined transfer criterion, VM controller 18 can delay the reset signal for a predefined time, e.g. using a hardware timer circuit. The VM controller can transfer (204) the reset signal to the VM after the predefined time has passed, or, optionally, can recheck (202-203) if an updated TR state meets the predefined transfer criterion and transfer (204) or block (205) the reset signal accordingly.

Having explained the flow of controlling a VM so as to block a reset signal under certain conditions, the benefit of system 10 comprising UPS 22 and VM controller 18 may now be apparent. If system 10 loses external power, UPS 22 functions to maintain, for a limited time, power to components of system 10, including at least VM 16. While power is supplied to VM 16 via UPS 22, data temporarily retained in VM 16 can be stored in NVM, whilst VM controller 18 blocks, subject to transfer criterion, transferring of the reset signal to VM when VM is powered.

Alternatively to the flow chart of controlling a VM detailed with reference to FIG. 2, the VM controller can include a timer module (e.g. a hardware timer circuit) configured to delay the intercepted reset signal for a predefined delay time, and transfer the reset signal to the VM after the delay time expires. Optionally, after the delay, the VM controller can check if the TR state meets the transfer criterion and transfer or block the reset signal accordingly.

Figure 3:
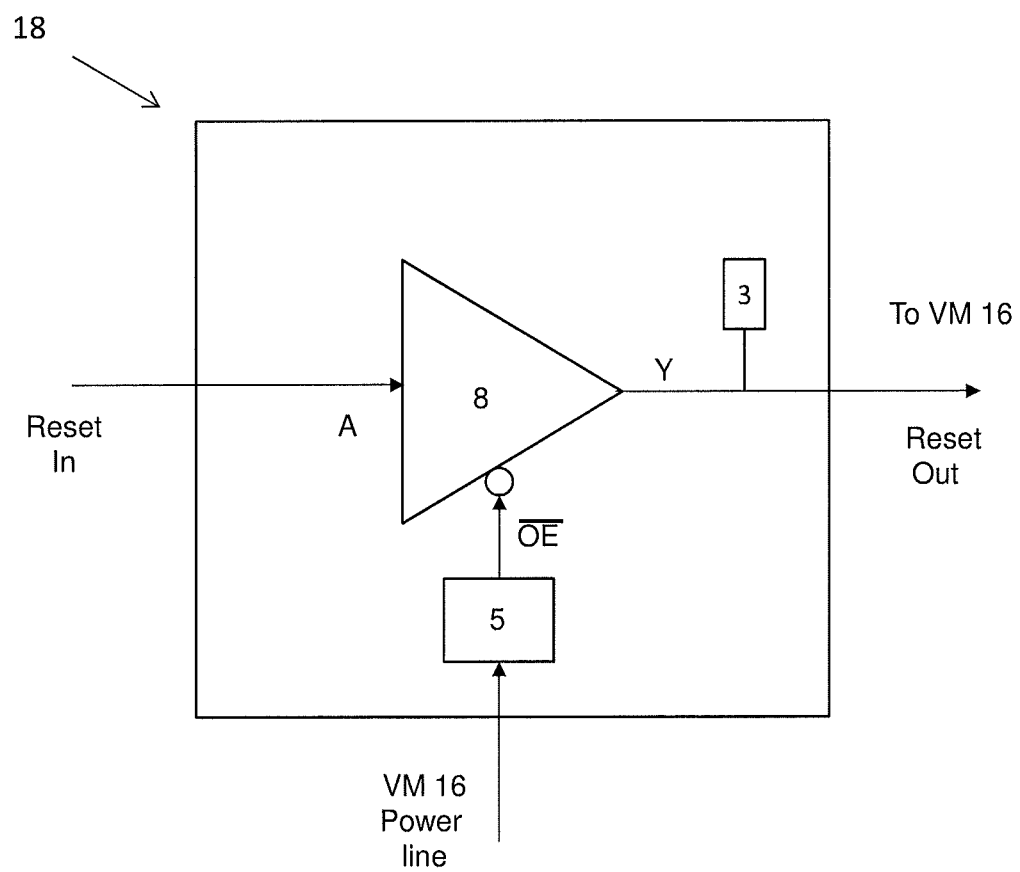
FIG. 3 is a functional block diagram of a VM controller according to certain embodiments of the presently disclosed subject matter.

Referring now to FIG. 3, there is illustrated a generalized functional diagram of a VM controller 18 according to certain embodiments. In the embodiment shown in FIG. 3, the TR state is characterized by a powering event related to VM 16 and the transfer criterion is a VM power up event having occurred within a predetermined timeframe n prior to the reset signal interception. VM controller 18 is configured to obtain (202) data indicative of a TR state of VM 16, and to check (203) if the TR state of VM 16 meets this predefined transfer criterion. If a power up event occurred at VM 16 in the timeframe n prior to reset signal interception, VM controller 18 enables the transferring of the reset signal to VM 16; otherwise VM controller 18 blocks the transferring of the reset signal to VM 16.

As illustrated in FIG. 3, VM controller 18 includes a delay line 5 serially connected to a control input ($\overline{OE}$) of a buffer 8. Buffer 8 further has a data input (A) that is connected to the VM reset signal wire (or pin) of the computer system. The output (Y) of buffer 8 is connected to the reset signal wire (or pin) of the VM. A pull-up resistor 3 is connected to output (Y). Buffer 8, delay line 5 and pull-up resistor 3 are each connected to a power line (not shown), which can, for example, be a power line of the VM.

In the embodiment shown in FIG. 3, buffer 8 is an active low three-state buffer. A three-state buffer (or "buffer" as used herein) should be expansively construed to cover any logic gate or combination of logic gates that transfers input (A) to output (Y) only if an output-enable input (OE) is a particular given value (either 1 or 0). If OE is not the particular value required for transferring A to Y, Y assumes a high impedance state, and is considered logically indeterminate (the "third" state). Indeterminate Y can be pulled up to 1 or down to 0 using a pull-up or pull-down resistor, respectively. A pull-up or pull-down resistor has no effect on Y if Y is already in a determinate state (1 or 0). Whereas "active high" buffers transfer A to Y when OE is logic (HIGH), "active low" buffers transfers A to Y when OE is logic 0 (LOW). When referring to an active low buffer, OE is commonly written as $\overline{OE}$. This practice is adopted herein.

Although buffer 8 as shown in FIG. 3 is active low, it should be appreciated that an active high buffer may be used instead, in which case an inverter can be coupled to the OE input of the active high buffer.

Delay line 5 illustrated in FIG. 3 is a circuit, e.g. integrated circuit (IC) or discrete implementation, that receives, as input, a logical state (0 or 1) indicative of VM power, and outputs the received logical state after an additive, and optionally configurable, delay of n. Thus, logical state "0" received by buffer 8 from delay line 5 is indicative for the buffer that the VM has been powered up during the timeframe n. On the other hand, logical state "1" received by buffer 8 from delay line 5 is indicative for the buffer that the VM has not been powered up during the timeframe n.

Input (A) of buffer 8 receives a reset signal characterized by one of two logical states: state A=0 (LOW reset signal) corresponds to an asserted reset signal and state A=1 (HIGH reset signal) corresponds to a de-asserted reset signal.

As detailed herein and with reference to FIG. 3, the discussion of "receiving", "intercepting", "transferring", and "blocking" a reset signal should be understood to mean "receiving", "intercepting", "transferring", and "blocking" an asserted reset signal (i.e. LOW logic state). Furthermore, "transferring" and "blocking" a reset signal should be understood to mean "transferring" and "blocking" an entire asserted reset signal, i.e. from assertion to de-assertion.

As noted, buffer 8 also receives from delay line 5 via the control input ($\overline{OE}$) data indicative of a powering event related to VM during the predetermined timeframe n. If $\overline{OE}$ is logical 0 input (A) is transferred to output (Y). If OE is logical 1, input (A) is not transferred to output (Y).

In FIG. 3, $\overline{OE}$ in a LOW state is indicative of VM 16 having been powered up (to a stabilized power state) in the previous t<n, where t is the elapsed time since a stabilization of power to VM 16. On the other hand, $\overline{OE}$ HIGH is indicative of VM 16 having received continuous stabilized power for at least the previous t>=n. If $\overline{OE}$ is HIGH, Y is indeterminate and therefore pull-up resistor 3 pulls Y to a HIGH state. Thus, the pull-up resistor enables a transferring of HIGH reset signal to the VM, informing the VM to continue operation without a reset.

For greater understanding, the following example is provided to illustrate how VM controller 18 in FIG. 3 blocks or transfers a reset signal based on a powering of the VM. For the purposes of this example, it is assumed that VM 16 is Double Date Rate Type 3 (DDR3) Synchronous Dynamic RAM (SDRAM) ("DDR3 memory"). For greater understanding, DDR3 memory is configured to receive power on the $V_{DD}$ pin, and a CMOS rail to rail reset signal on the RESET# pin (pin #168). During ordinary operation of DDR3 memory, $V_{DD}$ is required to be maintained HIGH (1.5V+/−0.075V) and RESET# is required to be maintained HIGH (1.20V-1.5V). DDR3 is reset by pulling RESET# LOW (<0.30V), causing data to be flushed. On cold boot, DDR3 memory is initialized by setting $V_{DD}$ to HIGH and asserting RESET# LOW for a minimum of 200 μs. On warm boot, DDR3 memory is initialized by asserting RESET# LOW for a minimum of 100 ns while $V_{DD}$ is maintained HIGH.

In FIG. 3, during read/write operations of VM 16, $V_{DD}$ is HIGH (VM 16 is powered) and RESET# is HIGH (de-asserted). Buffer 8 checks $\overline{OE}$, finds it HIGH, and blocks the transfer of RESET#, leaving Y indeterminate. Pull-up resistor 3 then pulls Y to HIGH, which causes RESET# HIGH to be passed to VM 16. If a warm boot occurs (no powering event at VM 16), $V_{DD}$ stays HIGH but reset circuit 11 asserts RESET# LOW, indicative of a reset signal. Buffer 8 checks $\overline{OE}$, finds it HIGH, and blocks the reset signal, leaving Y indeterminate. Pull-up resistor 3 then pulls Y HIGH, causing RESET# HIGH to be transferred to VM 16. Thus, the reset signal is blocked from reaching VM 16.

If a cold boot occurs, two events will happen. $V_{DD}$ will, at some point, change from LOW to HIGH and reset circuit 11 will, at some later point, assert RESET# for the required duration necessary to reset the VM and subsequently de-assert RESET#. Thus, n should be configured in delay line 5 so that the time difference between $V_{DD}$ having received stabilized power and RESET# having been de-asserted (after having been asserted) is less than n. Having configured n as such, VM controller 18 intercepts the reset signal at buffer 8, checks $\overline{OE}$, finds $\overline{OE}$ is LOW, and transfers the reset signal to VM 16.

The following truth table illustrates the possible values for Y in VM controller 18:

| | t < n | | t >= n | |
|---|---|---|---|---|
| A | $\overline{OE}$ | Y | $\overline{OE}$ | Y |
| 1 | 0 | 1 | 1 | 1 |
| 0 | 0 | 0 | 1 | 1 |

As the above table shows, a reset signal (A=0) is only transferred to Y, and the VM, if the reset signal is intercepted by the VM controller within a timeframe of a stabilization of power to the VM. Otherwise, the reset signal is not transferred. In this example, the TR state is a power up of the VM, or more specifically, a stabilization of power to the VM. The predefined criterion is met if the elapsed time between a stabilization of power to the VM and the reset signal interception is less than this timeframe. It is noted that an "elapsed time" between a stabilization of power to the VM and reset signal interception should be understood to mean a time beginning with the VM receiving stable power, and ending with the reset signal being de-asserted after having been asserted.

It is noted that the above example is similarly applicable to other DRAMs with appropriate modification where necessary. For example, if VM is DDR4 SDRAM, the reset signal will be asserted on the RESET_n pin, $V_{DD}$ is 1.2V+/−0.06.

In certain embodiments, n can be configured as the minimal expected time difference between a stabilization of power to the VM and a reset signal de-assertion following the computer system powering up. By way of non-limiting example, n can be between 0.10 milliseconds and 10 seconds. In some embodiments, VM controller 18 may also delay or postpone a reset signal from reaching a VM for a predetermined time. For example, VM controller 18 can include a hardware timer circuit which activates upon VM controller 18 intercepting a reset signal. Upon activation, the hardware timer can "count" a predefined number of seconds, during which the intercepted reset signal is not transferred to the VM. Once the hardware timer completes the count, the reset signal can be transferred to the VM. The reset signal can be delayed, for example, in order to copy the temporarily retained data to a persistent storage device prior to the data being lost.

It should be appreciated that the VM controller 18 shown in FIG. 3 represents certain embodiments of a VM controller, and that other embodiments are possible. For example, the functionality of the VM controller which transfers or blocks a reset signal in response to received data can be implemented using, instead of a buffer, other suitable hardware, including circuits and/or logic gates. In addition, it should be noted that although the above examples and FIG. 3 refer to a TR state of the VM, VM controller 18 is not limited to only checking a TR state of the memory. For example, VM controller 18 can instead check a TR state of system 10 (for example by checking for power on bus 24). VM controller 18 can also check a TR state of another component of system 10, e.g. a TR state of reset circuit 11.

As will be appreciated by one skilled in the art, in certain embodiments, VM controller 18 can be integrated with a VM. For example, the VM controller can be a logic circuit mounted on the printed circuit board (PCB) containing the VM. In certain other embodiments VM controller can be integrated with another component of a computer system that communicates with VM, such as a motherboard (not shown).

In other embodiments, VM controller 18 can be a logic circuit included in a device capable of interconnecting a component (e.g. a motherboard) of the computer system and the VM, as will be described below with reference to FIGS. 4A-4B.

Figure 4A:
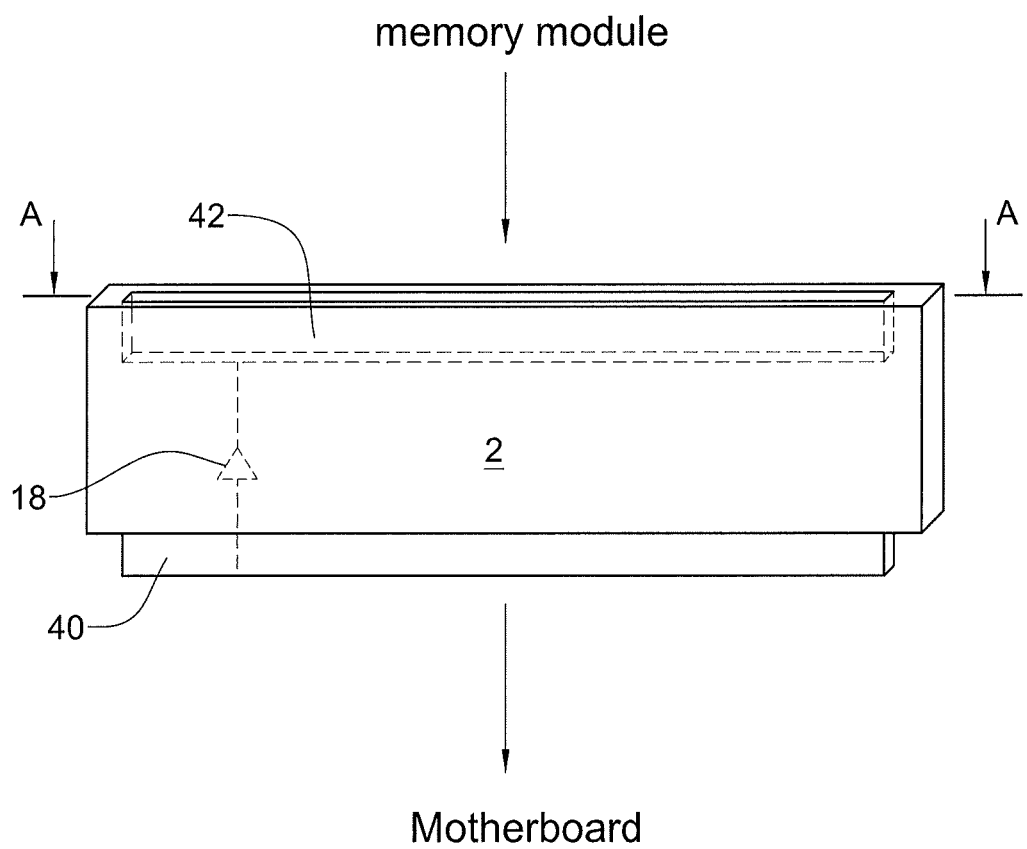
FIG. 4A is a schematic drawing of a socket extender according to certain embodiments of the presently disclosed subject matter.

Referring now to FIG. 4A, there is illustrated a generalized schematic drawing of a socket extender 2 comprising a VM controller 18 according to certain embodiments of the presently disclosed subject matter. In FIG. 4B, there is illustrated a cross-sectional view of the socket extender 2 shown in FIG. 4A taken along the line AA.

As shown in FIGS. 4A-4B, socket extender 2 includes: a connector 40 capable of plugging into a memory socket of a motherboard (MB), the connector 40 having a plurality of pins 44 for operatively communicating with the MB; a slot 42 capable of plugging in a VM, the slot 42 having a plurality of contacts 46 for operatively communicating with a plugged in VM; and a VM controller 18 operatively coupled between a pin capable of receiving a reset signal and a contact capable of transferring the reset signal.

As described above with reference to FIGS. 2-3, VM controller 18 is operable to intercept a reset signal transmitted via the MB and intended to cause a reset of least the VM, obtain data informative of a TR state, assess the TR state, and block the reset signal if the TR state does not meet a predefined criterion and transfer the reset signal if the TR state does meet a predefined criterion.

Optionally, at least one other pin and at least one other contact may be directly coupled to each other to transparently transfer data and/or signals other than a reset signal to the VM without interception by the VM controller.

It is to be understood that the presently disclosed subject matter is not limited in its application to the details set forth in the description contained herein or illustrated in the drawings. The presently disclosed subject matter is capable of other embodiments and of being practiced and carried out in various ways.

Those skilled in the art will readily appreciate that various modifications and changes can be applied to the embodiments of the presently disclosed subject matter as hereinbefore described without departing from its scope, defined in and by the appended claims.

The invention claimed is:

1. A method of controlling a volatile memory (VM), the method comprising:
intercepting, a reset signal intended to cause a reset of, at least, the VM, the interception provided by a VM controller operatively coupled to the VM;
assessing, by the VM controller, a transfer-related (TR) state related to the VM; and
blocking, by the VM controller, the intercepted reset signal from reaching the VM if the assessed TR state does not meet a predefined criterion, and transferring the reset signal to the VM if the assessed TR state meets the predefined criterion,
wherein the TR state is characterized by a powering event related to the VM having occurred during a predetermined timeframe prior to the interception, and the predefined criterion is met if the VM has been powered up during the timeframe and an elapsed time between a stabilization of VM power after powering up and reset signal interception is less than a predefined time.

2. The method of claim 1 further comprising obtaining, by the VM controller, data informative of the TR state, the data to be used for assessing the TR state.

3. The method of claim 1, wherein at least one of blocking the intercepted reset signal and transferring of the intercepted reset signal is provided with a predefined delay after the intercepting.

4. The method of claim 1, wherein assessing the TR state is provided with a predefined delay after the intercepting.

5. The method of claim 1, wherein the TR state is further characterized by a source of the reset signal, and the predefined criterion is met if the source of the reset signal is selected from a predefined list of sources.

6. A method of controlling a volatile memory (VM), the method comprising:
intercepting a reset signal intended to cause a reset of a plurality of VMs, each VM characterized by its own predefined transfer criterion, the interception provided by a VM controller operatively coupled to the plurality of VMs;
assessing, by the VM controller, a respective transfer-related (TR) state of each VM of the plurality of VMs,
comparing, by the VM controller for each given VM, the assessed TR state with the respective predefined criterion, and
transferring or blocking the reset signal to a given VM in accordance with the results of the comparison.

7. A method of controlling a volatile memory (VM) comprised in a computer system, the method comprising:
intercepting a reset signal originating in the computer system and intended to cause a reset of, at least, the VM, the interception provided by a VM controller comprised in the computer system and operatively coupled to the VM;
detecting, by the VM controller, if the VM has been powered-up during a predetermined timeframe prior to the interception; and
blocking, by the VM controller, the intercepted reset signal from reaching the VM if an elapsed time between a stabilization of VM power after powering-up and reset signal interception exceeds a predefined time and transferring the reset signal to the VM if the VM powering-up has been detected and the elapsed time between a stabilization of VM power after powering-up and reset signal interception does not exceed the predefined time.

8. The method of claim 7, wherein at least one of blocking the intercepted reset signal and transferring of the intercepted reset signal is provided with a predefined delay after the intercepting.

9. The method of claim 7, wherein detecting if the VM has been powered-up is provided with a predefined delay after the intercepting.

10. The method of claim 7, wherein the VM is dynamic random access memory.

11. The method of claim 7, wherein the VM controller is integrated with one of the group consisting of the VM, a motherboard comprised in the computer system and an extender of a memory socket of a motherboard comprised in the computer system.

12. A controller of a volatile memory (VM), the VM controller operatively connectable to the VM and configured to:
receive a reset signal originating in a computer system and intended to cause a reset of, at least, the VM;
detect if the VM has been powered-up during a predetermined timeframe prior to the receipt of the reset signal; and
block the received reset signal from reaching the VM if an elapsed time between a stabilization of VM power after powering-up and reset signal receipt exceeds a predefined time and transfer the reset signal to the VM if the VM powering-up has been detected and the elapsed time between a stabilization of VM power after powering-up and reset signal receipt does not exceed the predefined time.

13. The VM controller of claim 12 comprising a delay line and a buffer, wherein the buffer is configured:
   to receive, via a first input, from the delay line data indicative of VM power at the beginning of the predetermined timeframe;
   to detect if the VM has been powered-up during a predetermined timeframe prior to the receipt of the reset signal, detection to be provided using the data received from the delay line;
   to receive, via a second input, the reset signal; and
   to block the received reset signal from reaching the VM if the elapsed time between a stabilization of VM power after powering-up and reset signal receipt exceeds the predefined time and to transfer the reset signal to the VM if the VM powering-up has been detected and the elapsed time between a stabilization of VM power after powering-up and reset signal receipt does not exceed the predefined time.

14. The VM controller of claim 12 configured to block or transfer the received reset signal with a predefined delay after the reset signal has been received.

15. The VM controller of claim 12 integrated with one of the group consisting of the VM, a motherboard comprised in the computer system and an extender of a memory socket of a motherboard comprised in the computer system.

16. A device capable of interconnecting a motherboard and a volatile memory (VM), the device comprising:
   a connector configured to plug into a memory socket of the motherboard, the connector comprising a plurality of pins, at least one first pin to receive a reset signal transmitted via the motherboard and intended to cause a reset of, at least, the VM;
   a VM controller operatively coupled to the connecter and operable to:
      receive a reset signal originating in a computer system and intended to cause a reset of, at least, the VM;
      detect if the VM has been powered-up during a predetermined timeframe prior to the receipt of the reset signal; and
      block the received reset signal from reaching the VM if an elapsed time between a stabilization of VM power after powering-up and reset signal receipt exceeds the predefined time and transfer the reset signal to the VM if the VM powering-up has been detected and the elapsed time between a stabilization of VM power after powering-up and reset signal receipt does not exceeds the predefined time; and
   a slot operatively coupled to the VM controller and configured to enable plugging the VM into the device, the slot comprising a plurality of contacts, at least one first contact to transfer the reset signal to the VM.

17. The device of claim 16, wherein the VM controller comprises a delay line and a buffer, wherein the buffer is configured:
   to receive, via a first input, from the delay line data indicative of VM power at the beginning of the predetermined timeframe;
   to detect if the VM has been powered-up during a predetermined timeframe prior to the receipt of the reset signal, detection to be provided using the data received from the delay line;
   to receive, via a second input, the reset signal; and
   to block the received reset signal from reaching the VM if the VM powering-up has not been detected and to transfer the reset signal to the VM if the VM powering-up has been detected.

18. The device of claim 16, wherein the VM controller is configured to block or transfer the received reset signal with a predefined delay after the reset signal has been received.

19. The device of claim 16, wherein the plurality of pins includes at least one second pin, and the plurality of contacts includes at least one second contact, wherein the at least one second pin and the at least one second contact are coupled in a manner enabling transferring of data between the motherboard and the VM.

* * * * *